(12) United States Patent
Nguyen

(10) Patent No.: US 10,535,549 B2
(45) Date of Patent: Jan. 14, 2020

(54) LIFT PIN HOLDER

(71) Applicant: APPLIED MATERIALS, INC., Santa Clara, CA (US)

(72) Inventor: Khiem K. Nguyen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 257 days.

(21) Appl. No.: 15/796,242

(22) Filed: Oct. 27, 2017

(65) Prior Publication Data

US 2019/0131165 A1     May 2, 2019

(51) Int. Cl.
*H01L 21/687* (2006.01)
*H01L 21/67* (2006.01)
*B23Q 7/00* (2006.01)
*H01J 37/32* (2006.01)

(52) U.S. Cl.
CPC ........ *H01L 21/68742* (2013.01); *B23Q 7/005* (2013.01); *H01J 37/32733* (2013.01); *H01L 21/67069* (2013.01); *H01J 37/32724* (2013.01); *H01J 2237/20235* (2013.01)

(58) Field of Classification Search
CPC ........ H01L 21/68742; H01L 21/68785; B23Q 7/005
See application file for complete search history.

(56) References Cited

U.S. PATENT DOCUMENTS

| 5,848,670 | A  | * | 12/1998 | Salzman | ................... | B66F 7/00 |
| | | | | | | 187/272 |
| 6,435,798 | B1 | * | 8/2002 | Satoh | .................. | C23C 16/4586 |
| | | | | | | 118/728 |
| 10,262,887 | B2 | * | 4/2019 | Hao | .................. | H01L 21/68785 |
| 2002/0011204 | A1 | * | 1/2002 | Gujer | .................... | C23C 16/405 |
| | | | | | | 118/500 |

(Continued)

FOREIGN PATENT DOCUMENTS

KR     10-2007-0080922 A     8/2007
KR         10-0833315 B1     5/2008

(Continued)

OTHER PUBLICATIONS

International Search Report and Written Opinion dated Mar. 11, 2019 for PCT Application No. PCT/US2018/057457.

*Primary Examiner* — Tyrone V Hall, Jr.
(74) *Attorney, Agent, or Firm* — Moser Taboada; Alan Taboada

(57) ABSTRACT

Embodiments of lift pin holders are disclosed herein. In some embodiments, a lift pin holder includes a housing member having an upper portion and a lower portion, wherein the upper portion includes an annular wall defining a central space; a support member disposed at least partially within the central space and having a base and an upwardly protruding portion configured to support a lift pin; a first gripper disposed atop the support member and having a first plurality of prongs protruding upward from a body of the first gripper and configured to grip the lift pin; and a second (Continued)

gripper disposed atop the base of the support member and having a second plurality of prongs protruding upward from a body of the second gripper and are configured to grip the lift pin, wherein the first gripper is disposed within the third central opening.

20 Claims, 5 Drawing Sheets

(56) References Cited

U.S. PATENT DOCUMENTS

| | | | | |
|---|---|---|---|---|
| 2003/0205329 | A1* | 11/2003 | Gujer | C23C 16/405 |
| | | | | 156/345.51 |
| 2005/0265818 | A1* | 12/2005 | Blonigan | H01L 21/67259 |
| | | | | 414/800 |
| 2006/0156981 | A1* | 7/2006 | Fondurulia | C23C 16/4408 |
| | | | | 118/715 |
| 2006/0156988 | A1* | 7/2006 | Wu | C23C 16/4586 |
| | | | | 118/728 |
| 2009/0314211 | A1* | 12/2009 | Du Bois | H01L 21/68742 |
| | | | | 118/729 |
| 2014/0041579 | A1* | 2/2014 | Jeong | B05C 13/00 |
| | | | | 118/500 |
| 2015/0364347 | A1 | 12/2015 | Nguyen et al. | |
| 2017/0133260 | A1* | 5/2017 | Pohl | H01L 21/68742 |
| 2017/0221750 | A1 | 8/2017 | Cotlear et al. | |
| 2018/0090363 | A1* | 3/2018 | Breninger | H01L 21/68742 |
| 2018/0166259 | A1 | 6/2018 | Ueda | |

FOREIGN PATENT DOCUMENTS

| | | |
|---|---|---|
| KR | 10-2012-0100017 A | 9/2012 |
| KR | 10-2014-0062593 A | 5/2014 |

* cited by examiner

LIFT PIN HOLDER

FIELD

Embodiments of the present disclosure generally relate to substrate processing.

BACKGROUND

In semiconductor processing, lift pins are used to lift and lower a semiconductor substrate onto a substrate support in a process chamber. Typically, a robotic arm transports the substrate into an upper portion of the process chamber where the substrate is deposited on lift pins that extend upwardly through the substrate support. The lift pins are then lowered into a lower portion of the process chamber to place the substrate on the substrate support. Afterwards, the robotic arm is withdrawn from the chamber.

After processing of the substrate, the lift pins are raised upward through bushings in the substrate support to lift the substrate off the substrate support by pushing up against the substrate. The robotic arm is then reinserted below the substrate to withdraw the processed substrate from the chamber. The inventors have discovered the conventional lift pin holders do not secure the lift pin well enough, thus allowing the lift pin to lean and rub against the bushings in the substrate support.

An additional problem with conventional lift pin assemblies arises when the lift pins attempt to lift the substrate off the substrate support and the movement of the lift pins is not a smooth continuous movement, but instead stuttered movement. The inventors have discovered that the stuttered movement is caused by debris falling into lift pin holders beneath the substrate support that support the lift pins. The stuttered movement would cause vibrations, which would cause particles generated from movement of the substrate to fall into the lift pin holder. The debris causes the lift pin to rub against the bushing as the lift pin is moved up or down. As a result, damage to the substrate may occur due to the stuttering movement of the lift pin. To address the stuttering issue, cleaning solutions have been used to clean the lift pin holders. However, because the cleaning does not address the underlying problem, debris falls into the lift pin holder again.

Therefore, the inventor has provided an improved lift pin holder and lift pin assemblies incorporating same.

SUMMARY

Embodiments of lift pin holders are disclosed herein. In some embodiments, a lift pin holder includes a housing member having an upper portion and a lower portion, wherein the upper portion includes an annular wall defining a central space; a support member disposed at least partially within the central space and having a base and an upwardly protruding portion configured to support a lift pin; a first gripper disposed atop the support member and having a first plurality of prongs protruding upward from a body of the first gripper, wherein the first gripper includes a first central opening disposed between the first plurality of prongs and extending through body of the first gripper, wherein the first plurality of prongs are configured to grip the lift pin when extending into the first central opening, and wherein the upwardly protruding portion of the support member extends into the first central opening; and a second gripper disposed atop the base of the support member and having a second plurality of prongs protruding upward from a body of the second gripper, wherein the second gripper includes a second central opening disposed between the second plurality of prongs and a third central opening extending through body of the second gripper and open to the second central opening, wherein the second plurality of prongs are configured to grip the lift pin when extending into the second central opening, and wherein the first gripper is disposed within the third central opening, wherein the housing member, the support member, the first gripper, and the second gripper are coaxial.

In some embodiments, a lift pin assembly includes a base; a plurality of support elements extending upwardly from the base; a plurality of lift pin holders coupled to an upper portion of corresponding ones of the plurality of support elements; and a plurality of lift pins corresponding to the plurality of lift pin holders. Each of the plurality of lift pin holders includes a housing member having an upper portion and a lower portion, wherein the upper portion includes an annular wall defining a central space, wherein the lower portion of the housing member includes a recess configured to receive a corresponding support element and to prevent relative rotation of the corresponding support element within the recess; a support member disposed at least partially within the central space and having a base and an upwardly protruding portion configured to support a lift pin; a first gripper disposed atop the support member and having a first plurality of prongs protruding upward from a body of the first gripper, wherein the first gripper includes a first central opening disposed between the first plurality of prongs and extending through body of the first gripper, wherein the first plurality of prongs are configured to grip the lift pin extending into the first central opening, and wherein the upwardly protruding portion of the support member extends into the first central opening; and a second gripper disposed atop the base of the support member and having a second plurality of prongs protruding upward from a body of the second gripper, wherein the second gripper includes a second central opening disposed between the second plurality of prongs and a third central opening extending through body of the second gripper and open to the second central opening, wherein the second plurality of prongs are configured to grip the lift pin extending into the second central opening, and wherein the first gripper is disposed within the third central opening, wherein the housing member, the support member, the first gripper, and the second gripper are coaxial. A bottom portion of each of the plurality of lift pins is disposed within a corresponding one of the plurality of lift pin holders.

In some embodiments, a process chamber includes a chamber body; a lid disposed above the chamber body, wherein the lid and the chamber body define an interior volume; a substrate support disposed within the interior volume; a plurality of lift pin bushings disposed within the substrate support and configured to allow a corresponding plurality of lift pins to pass through the plurality of lift pin bushings; and a lift pin assembly. The lift pin assembly includes a base; a plurality of support elements extending upwardly from the base; a plurality of lift pin holders coupled to an upper portion of corresponding ones of the plurality of support elements. Each of the plurality of lift pin holders includes a housing member having an upper portion and a lower portion, wherein the upper portion includes an annular wall defining a central space, wherein the lower portion of the housing member includes a recess configured to receive a corresponding support element and to prevent relative rotation of the corresponding support element within the recess; a support member disposed at least partially within the central space and having a base and an upwardly protruding portion configured to support a lift pin; a first gripper disposed atop the support member and having a first plurality of prongs protruding upward from a body of the first gripper, wherein the first gripper includes a first central opening disposed between the first plurality of prongs and extending through body of the first gripper, wherein the first plurality of prongs are configured to grip the lift pin extending into the first central opening, and wherein the upwardly protruding portion of the support member extends into the first central opening; and a second gripper disposed atop the base of the support member and having a second plurality of prongs protruding upward from a body of the second gripper, wherein the second gripper includes a second central opening disposed between the second plurality of prongs and a third central opening extending through body of the second gripper and open to the second central opening, wherein the second plurality of prongs are configured to grip the lift pin extending into the second central opening, and wherein the first gripper is disposed within the third central opening, wherein the housing member, the support member, the first gripper, and the second gripper are coaxial.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are not limiting of scope, for the disclosure may have other equally effective embodiments.

Figure 1:
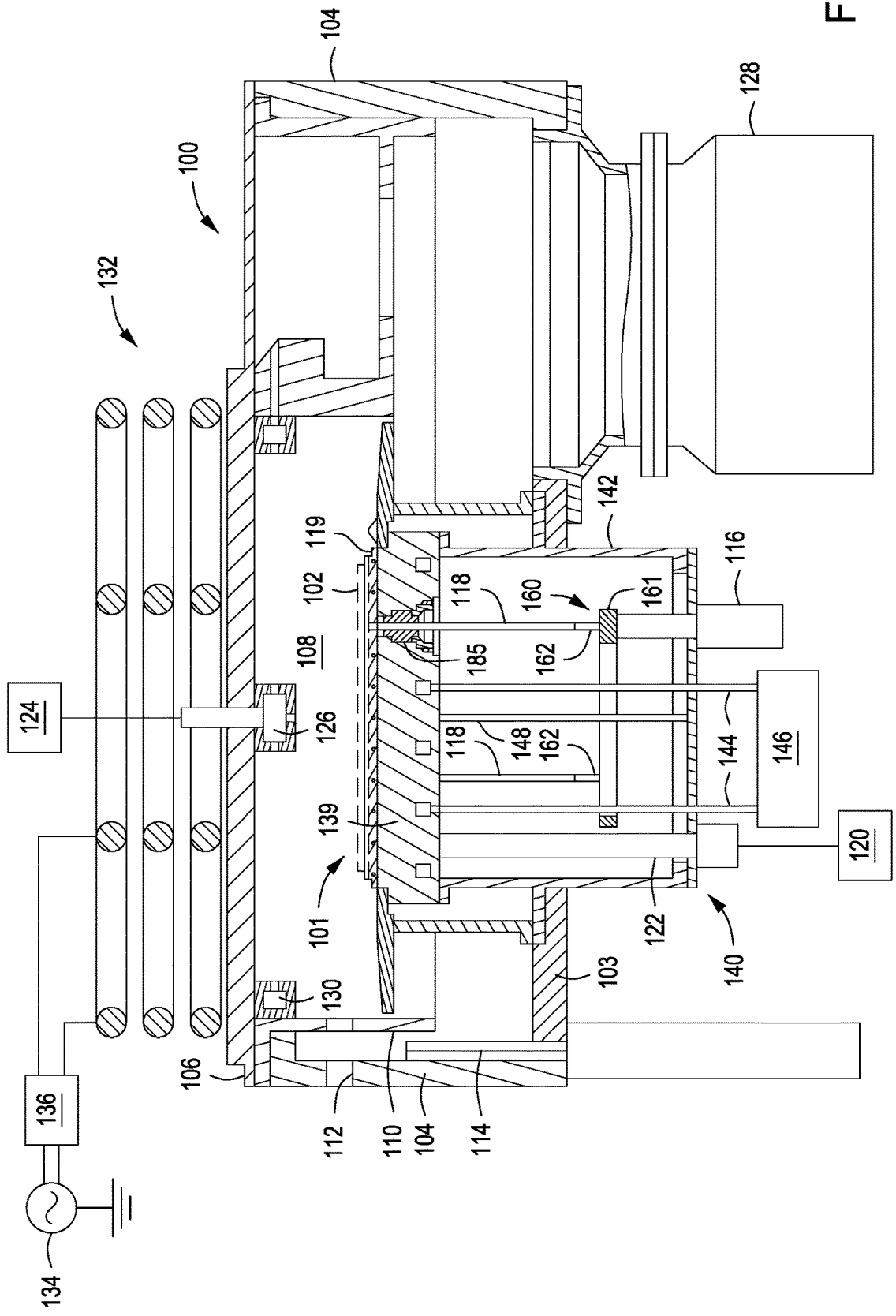
FIG. 1 depicts a schematic, cross-section view of an illustrative process chamber in which a lift pin holder may be used in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of lift pin holders and lift pin assemblies incorporating same are disclosed herein. The inventive lift pin holder advantageously reduces or eliminates the issues with conventional lift pin holders that cause the lift pin holders to become stuck against debris that has fallen into the lift pin holder. The inventive lift pin holder eliminates sharp edges that can come into contact with debris that can fall into the lift pin holder, thus significantly reducing the risk of elements of the lift pin holder becoming stuck on the debris. The inventive lift pin holder further improves the stability of the lift pin by providing additional support to secure the lift pin within the lift pin holder.

FIG. 1 depicts a schematic, cross-section view of an illustrative substrate process chamber 100 that in which a lift pin holder and lift pin assembly in accordance with some embodiments of the present disclosure may be used. Suitable reactors that may be adapted for use with the teachings disclosed herein include, for example, the TETRA™ I, TETRA™ II and TETRA™ III Photomask etch systems, all of which are available from Applied Materials, Inc. of Santa Clara, Calif. The particular embodiment of the process chamber 100 shown herein is provided for illustrative purposes and should not be used to limit the scope of the disclosure. The inventive lift pin holder may be fitted to any process chamber utilizing a similar lift pin assembly for the advantages disclosed herein.

The process chamber 100 generally comprises a chamber body having a bottom 103, a sidewall 104 and a chamber lid 106 disposed over the sidewall 104 of the chamber body defining a processing volume 108. The process chamber 100 further includes a substrate support assembly 101. The process chamber 100 further includes a liner 110 disposed in the processing volume 108 to prevent the sidewall 104 from damage and contamination from the processing chemistry and/or processing by-products. A slit valve door opening 112 is formed through the sidewall 104 and the liner 110 to allow passage of the substrates and substrate transfer mechanism disposed in a system, such as a cluster tool that is coupled to the process chamber 100. A slit valve door 114 selectively opens and closes the slit valve door opening 112.

The substrate support assembly 101, which includes a substrate support 139 and a connection region 140, is disposed in the processing volume 108 and is supported by support(s) 142. In some embodiments, the substrate support 139 may be an electrostatic chuck. A lift 116 is configured to raise and lower lift pins 118 disposed on a lift pin assembly 160 (as described below with respect to FIG. 2) through bushings 185 disposed in the substrate support 139 during processing and loading/unloading the substrate 102. The lift pin assembly 160 includes a base 161 and a plurality of support elements 162. The connection region 140 of the substrate support assembly 101 is generally not in fluid communication with the processing volume 108. In some embodiments, the connection region 140 may include a plurality of electrical connections such as, for example, thermocouple wires, heater element wires, shielded e-chuck electrode wires, etc. and tubes for transferring fluid through the substrate support assembly 101. In some embodiments, the connection region 140 may also include the support(s) 142, cooling tubes 144 and electrical connections 122. In some embodiments, the electrical connections 122 couple the substrate support assembly 101 to a bias power source 120 for generating chucking force to secure the substrate 102 on the substrate support assembly 101. One or more heating elements 119, such as resistive heating elements, may be embedded in the substrate support 139 for heating and maintaining the substrate 102 to a predetermined temperature. The one or more heating elements 119 may be used to heat the substrate 102 to a desired processing temperature. In some embodiments, the connection region 140 may also include cooling tubes 144 for flowing a coolant through the substrate support 139. The cooling tubes may be connected to a heat exchanger 146. In some embodiments, a temperature measuring device 148 may be coupled to the substrate support assembly 101.

In some embodiments, one or more processing gases may be supplied to the processing volume 108 from a gas source 124 via an inlet 126. A vacuum pump 128 is in fluid communication with the processing volume 108 to pump the processing volume 108 and maintain a low pressure environment through a plenum 130.

In some embodiments, the process chamber 100 further includes an antenna assembly 132 disposed outside the chamber lid 106. The antenna assembly 132 may be coupled to a radio frequency (RF) plasma power source 134 through a matching network 136. During processing, the antenna assembly 132 is energized with RF power provided by the RF plasma power source 134 to ignite the processing gases within the processing volume 108 to form a plasma and to maintain the plasma during processing of the substrate 102.

Figure 2:
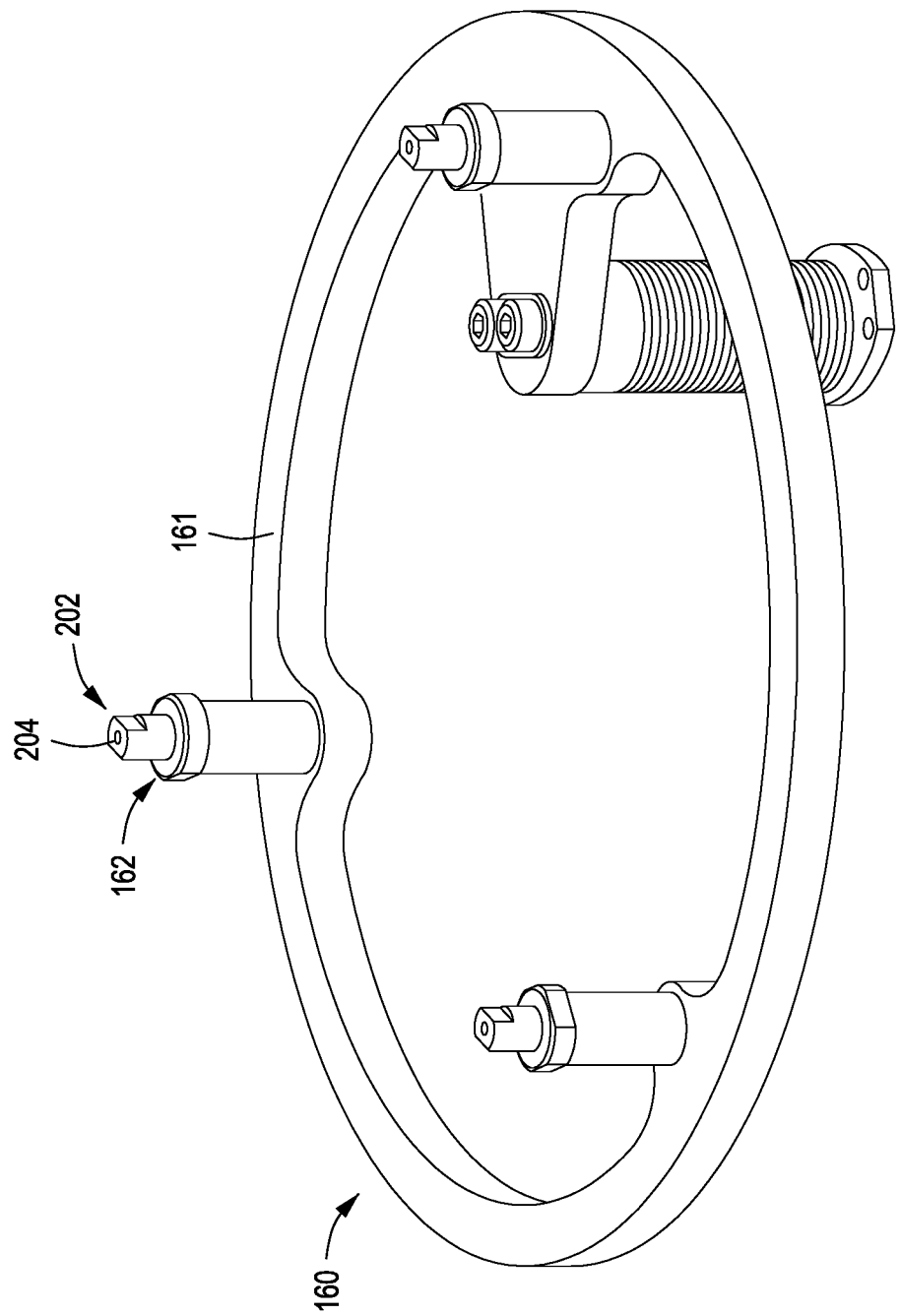
FIG. 2 illustrates a perspective view of a lift pin assembly in accordance with some embodiments of the present disclosure.

FIG. 2 illustrates a perspective view of the lift pin assembly 160 according to embodiments disclosed herein. As shown in FIG. 2, the lift pin assembly 160 includes the base 161 and a plurality of support elements 162. The base 161 may be any suitable shape, such as, for example, circular. In some embodiments, the base 161 may have the same shape as the substrate to be processed in the processing chamber 100. In some embodiments, the base 161 may be annular, as shown in FIG. 2. Each support element 162 is configured to support a lift pin 118 via a lift pin holder, as discussed below with respect to FIGS. 3A-5. The number of lift pins 118 and support elements 162 may vary based on the configuration of the processing chamber 100. In some embodiments, the lift pin assembly 160 includes three support elements 162 disposed on the base 161 for supporting three lift pins 118.

Figure 3A:
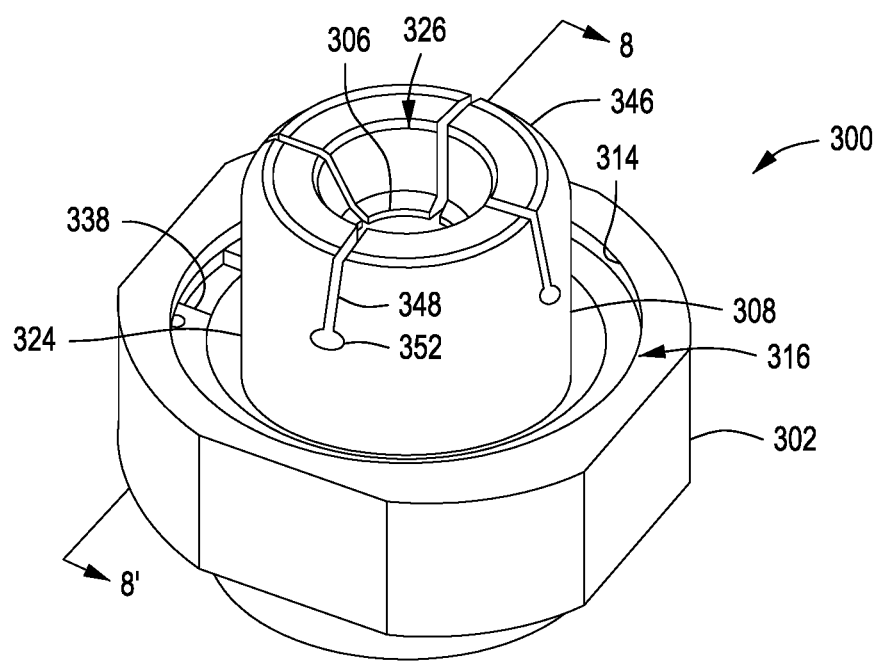
FIG. 3A depicts an isometric view of a lift pin holder in accordance with some embodiments of the present disclosure.
Figure 3B:
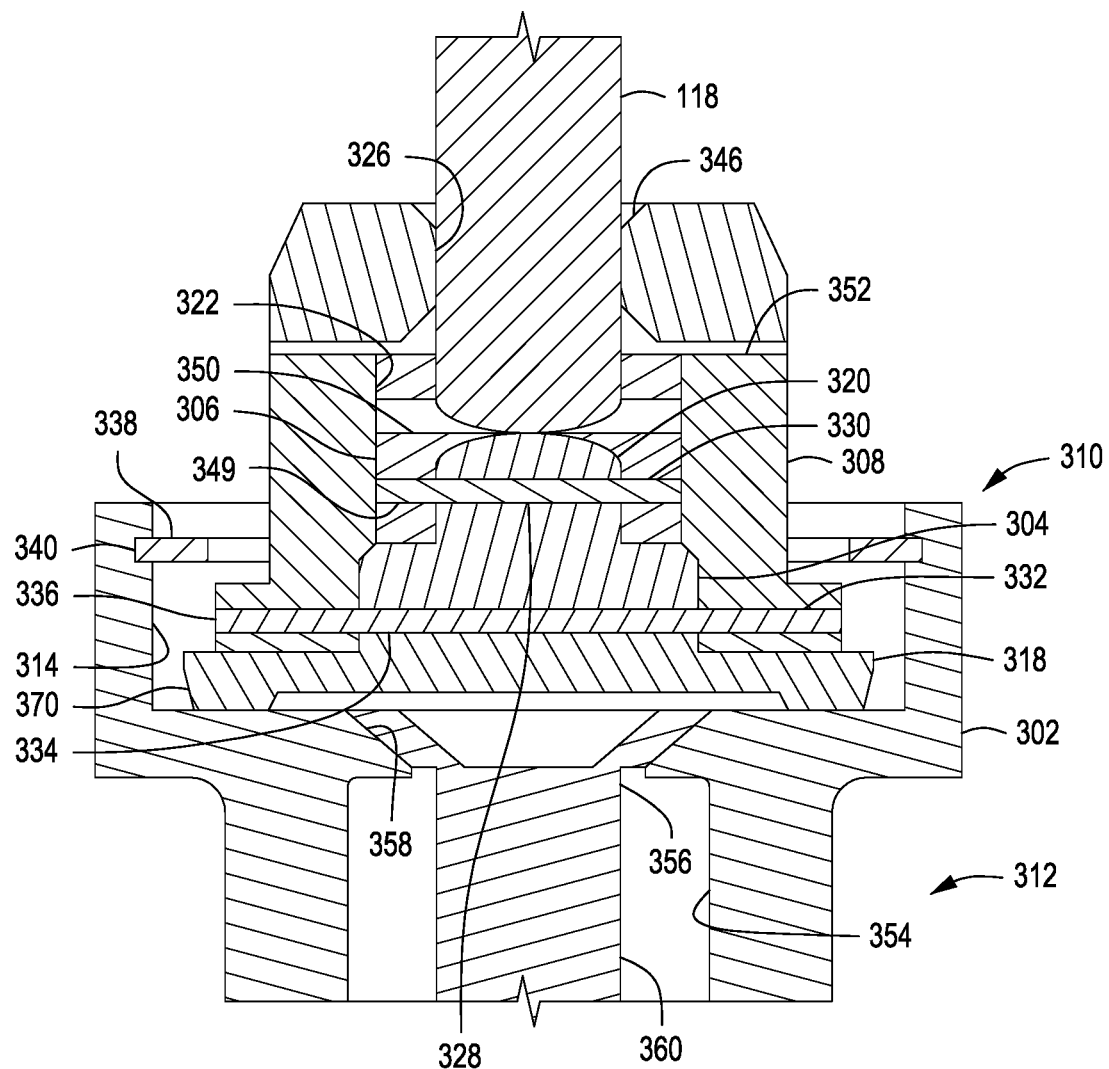
FIG. 3B depicts a cross-sectional view of the lift pin holder of FIG. 3A taken along line B-B'.

FIG. 3A depicts an isometric view of a lift pin holder 300 in accordance with some embodiments of the present disclosure. FIG. 3B depicts a cross-sectional view of the lift pin holder 300 of FIG. 3A taken along line B-B'. In some embodiments, the lift pin holder 300 includes a housing member 302, a support member 304, a first gripper 306, and a second gripper 308. In some embodiments, the housing member 302 and the support member 304 are formed of stainless steel. In such embodiments, surfaces of the housing member 302 and the support member 304 may additionally be electro polished to enhance the durability of the contact surfaces of the housing member 302 and the support member 304. In some embodiments, the first and second grippers 306, 308 are formed of a process-compatible plastic such as, for example, an organic thermoplastic polymer (e.g., PEEK) or a polyimide based plastic (e.g., VESPEL®). In some embodiments, the surface finish of the support member 304 is less than 22 Ra to minimize or prevent the support member 304 from becoming stuck on any debris that has fallen into the central space 316. In some embodiments, at least the bottom edges 370 of the support member 304 have a radius between about 0.025 inches and about 0.040 inches to further minimize or prevent the support member 304 from becoming stuck on any debris that has fallen into the central space 316. In some embodiments, The housing member 302 has an upper portion 310 and a lower portion 312. The upper portion 310 includes an annular wall 314 defining a central space 316. The support member 304 is disposed at least partially within the central space 316 and has a base 318 and an upwardly protruding portion 320 configured to support the lift pin 118. The first gripper 306 (also shown in FIG. 5) is disposed atop the support member 304.

Figure 5:
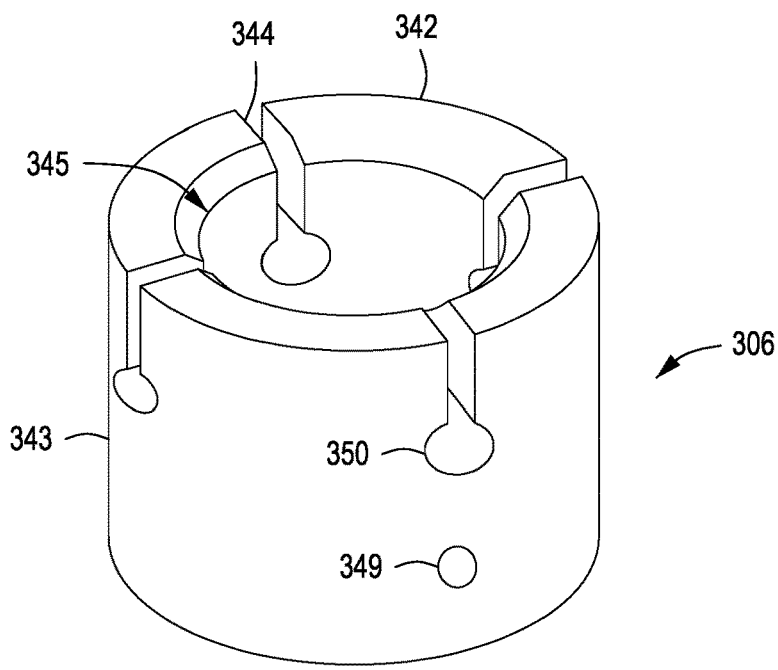
FIG. 5 depicts an isometric view of a gripper for use in a lift pin holder in accordance with some embodiments of the present disclosure.

Referring to FIG. 5, in some embodiments, the first gripper 306 includes a first plurality of prongs 342 extending upward from a body 343. The first plurality of prongs 342 are separated by a first plurality of slots 344 and surround a first central opening 345 that extends through the first gripper 306. The upwardly protruding portion 320 of the support member 304 extends into the first central opening 345. A first inner diameter of the first central opening 345 is less than a diameter of the lift pin 118 so that when the lift pin 118 is inserted into the first gripper 306, the first plurality of prongs 342 flex outward to allow the lift pin 118 to pass into the first central opening 345. Because the inner diameter of the first central opening 345 is less than the diameter of the lift pin 118, the first plurality of prongs 342 grip the lift pin 118 by exerting a radially inwardly directed force against the lift pin 118 to hold the lift pin 118 in place.

Returning to FIGS. 3A and 3B, the second gripper 308 is disposed atop the base 318 of the support member 304 and includes a second plurality of prongs 346 protruding upward from a body 324 of the second gripper 308. The second gripper 308 includes a second central opening 326 disposed between the second plurality of prongs 346 and a third central opening 322 extending through the body of the second gripper 308 and open to the second central opening 326. The second plurality of prongs 346 are configured to grip the lift pin 118 extending into the second central opening 326. The first gripper 306 is disposed within the third central opening 322.

The second plurality of prongs 346 are separated by a second plurality of slots 348. Similar to the first central opening 345 and the first plurality of prongs 342, the second central opening 326 has a second diameter less than the diameter of the lift pin 118 so that when the lift pin 118 is inserted into the second gripper 308, the second plurality of prongs 346 flex outward to allow the lift pin 118 to pass into the second central opening 326. As such, the second gripper 308 advantageously provides an additional holding/stabilizing force on the lift pin 118. In some embodiments, the housing member 302, the support member 304, the first gripper 306, and the second gripper 308 are coaxial.

In some embodiments, the first gripper 306 includes a first set of collinear holes 349 (one shown in FIG. 5, but both shown in cross-section in FIG. 3B) disposed through opposite sides of the first gripper 306. In such embodiments, the support member 304 includes a first through hole 328 disposed coaxially with the first set of collinear holes 349. A first locking pin 330 is disposed through the first set of collinear holes 349 and the first through hole 328 to fix a relative position of the first gripper 306 with respect to the support member 304.

In some embodiments, the second gripper 308 includes a second set of collinear holes 332 disposed through opposite sides of the second gripper 308. In such embodiments, the support member 304 additionally includes a second through hole 334 disposed coaxially with the second set of collinear holes 332. A second locking pin 336 is disposed through the second set of collinear holes 332 and the second through hole 334 to fix a relative position of the second gripper 308 with respect to the support member 304.

In some embodiments, the lift pin holder 300 further includes an annular retaining ring 338 (e.g., a snap ring) disposed in an annular channel 340 of the housing member 302. The annular retaining ring 338 is configured to prevent the support member 304, the first gripper 306, and the second gripper 308 from falling out of the housing member 302 (i.e., prevents vertical movement out of the housing member 302).

In some embodiments, the first gripper 306 includes a first plurality of relief holes 350 disposed at the bottom of and open to the first plurality of slots 344 to allow for thermal expansion of the first plurality of prongs 342. Similarly, in some embodiments, the second gripper 308 includes a second plurality of relief holes 352 disposed at the bottom of and open to the second plurality of slots 348 to allow for thermal expansion of the second plurality of prongs 346.

Figure 4:
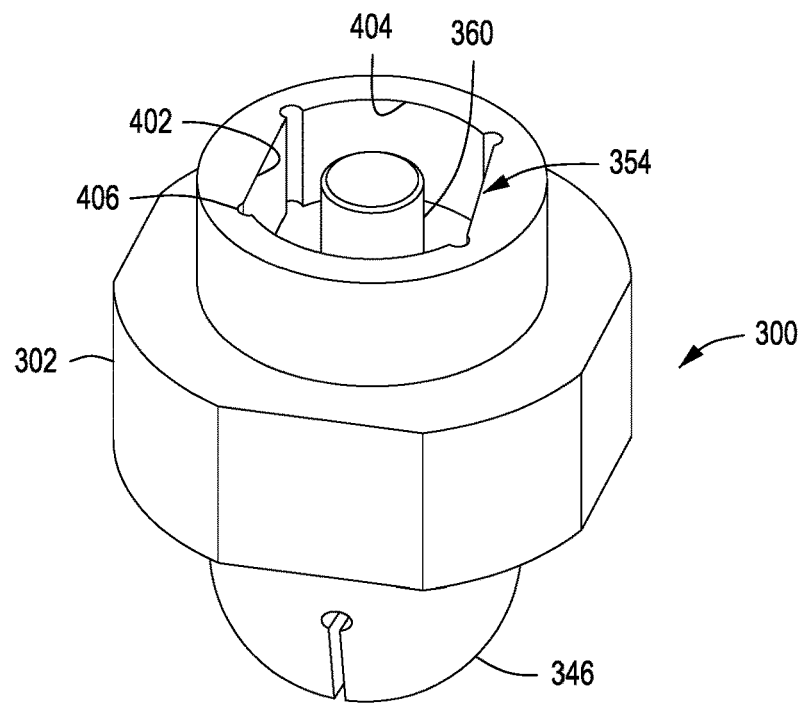
FIG. 4 depicts a bottom isometric view of a lift pin holder in accordance with some embodiments of the present disclosure.

In some embodiments, the lower portion of the housing member 302 includes a recess 354 configured to receive one of the support elements 162 of the lift pin assembly 160. The recess 354 is configured to prevent relative rotation of the support element 162 within the recess 354. Referring to FIG. 4, in some embodiments, the recess 354 may include one or more straight walls 402 and one or more curved walls 404. Referring to FIG. 2, an upper portion 202 of each support element 162 may have a corresponding shape so that when the upper portion 202 is inserted into the recess 354, rotation of the lift pin holder 300 relative to the support element 162 is advantageously prevented. In some embodiments, a plurality of relief slots 406 may additionally be provided to the recess 354 to compensate for thermal expansion of the upper portion 202 within the recess 354.

In some embodiments, the housing member 302 may additionally include a fixation element 356 extending through a hole 358 in the lower portion 312 of the housing member 302 and into the recess 354. The fixation element 356 is configured to couple the support element 162 to the housing member 302. For example, the fixation element 356 may be a screw (e.g., a countersink screw) having a threaded shaft 360 configured to be screwed into a correspondingly threaded hole 204 in the upper portion 202 of the support element 162.

While the foregoing is directed to embodiments of the present disclosure, other and further embodiments of the disclosure may be devised without departing from the basic scope thereof.

The invention claimed is:

1. A lift pin holder, comprising:
    a housing member having an upper portion and a lower portion, wherein the upper portion includes an annular wall defining a central space;
    a support member disposed at least partially within the central space and having a base and an upwardly protruding portion configured to support a lift pin;
    a first gripper disposed atop the support member and having a first plurality of prongs protruding upward from a body of the first gripper, wherein the first gripper includes a first central opening disposed between the first plurality of prongs and extending through body of the first gripper, wherein the first plurality of prongs are configured to grip the lift pin when extending into the first central opening, and wherein the upwardly protruding portion of the support member extends into the first central opening; and
    a second gripper disposed atop the base of the support member and having a second plurality of prongs protruding upward from a body of the second gripper, wherein the second gripper includes a second central opening disposed between the second plurality of prongs and a third central opening extending through body of the second gripper and open to the second central opening, wherein the second plurality of prongs are configured to grip the lift pin when extending into the second central opening, and wherein the first gripper is disposed within the third central opening, wherein the housing member, the support member, the first gripper, and the second gripper are coaxial.

2. The lift pin holder of claim 1, wherein the first gripper includes a first set of collinear holes disposed through opposite sides of the first gripper, and wherein the support member includes a first through hole disposed coaxially with the first set of collinear holes, the lift pin holder further comprising:
    a first locking pin disposed through the first set of collinear holes and the first through hole to fix a relative position of the first gripper with respect to the support member.

3. The lift pin holder of claim 2, wherein the second gripper includes a second set of collinear holes disposed through opposite sides of the second gripper, and wherein the support member includes a second through hole disposed coaxially with the second set of collinear holes, the lift pin holder further comprising:
    a second locking pin disposed through the second set of collinear holes and the second through hole to fix a relative position of the second gripper with respect to the support member.

4. The lift pin holder of claim 1, further comprising:
    an annular retaining ring disposed in an annular channel of the housing member and configured to prevent the support member, the first gripper, and the second gripper from falling out of the housing member.

5. The lift pin holder of claim 1, wherein the first plurality of prongs are separated by a first plurality of slots, wherein the first central opening has a first inner diameter less than a diameter of the lift pin, wherein the second plurality of prongs are separated by a second plurality of slots, and wherein the second central opening has a second inner diameter less than the diameter of the lift pin.

6. The lift pin holder of claim 5, wherein the first gripper includes a first plurality of relief holes at a bottom of the first plurality of slots and open to the first plurality of slots, and wherein the second gripper includes a second plurality of relief holes at a bottom of the second plurality of slots and open to the second plurality of slots.

7. The lift pin holder of claim 1, wherein the lower portion of the housing member includes a recess configured to receive a support element of a lift pin assembly and to prevent relative rotation of the support element within the recess.

8. The lift pin holder of claim 7, wherein the housing member includes a fixation element extending through a hole in the lower portion of the housing member and into the recess, and wherein the fixation element is configured to couple the support element to the housing member.

9. The lift pin holder of claim 8, wherein the fixation element is a screw.

10. The lift pin holder of claim 1, wherein the housing member and the support member are formed of stainless steel.

11. The lift pin holder of claim 10, wherein a surface finish of the support member is less than 22 Ra.

12. The lift pin holder of claim 1, wherein the first and second grippers are formed of a process-compatible plastic.

13. A lift pin assembly, comprising:
    a base;
    a plurality of support elements extending upwardly from the base;
    a plurality of lift pin holders coupled to an upper portion of corresponding ones of the plurality of support elements, wherein each of the plurality of lift pin holders comprises:

a housing member having an upper portion and a lower portion, wherein the upper portion includes an annular wall defining a central space, wherein the lower portion of the housing member includes a recess configured to receive a corresponding support element and to prevent relative rotation of the corresponding support element within the recess;

a support member disposed at least partially within the central space and having a base and an upwardly protruding portion configured to support a lift pin;

a first gripper disposed atop the support member and having a first plurality of prongs protruding upward from a body of the first gripper, wherein the first gripper includes a first central opening disposed between the first plurality of prongs and extending through body of the first gripper, wherein the first plurality of prongs are configured to grip the lift pin extending into the first central opening, and wherein the upwardly protruding portion of the support member extends into the first central opening; and a second gripper disposed atop the base of the support member and having a second plurality of prongs protruding upward from a body of the second gripper, wherein the second gripper includes a second central opening disposed between the second plurality of prongs and a third central opening extending through body of the second gripper and open to the second central opening, wherein the second plurality of prongs are configured to grip the lift pin extending into the second central opening, and wherein the first gripper is disposed within the third central opening, wherein the housing member, the support member, the first gripper, and the second gripper are coaxial; and a plurality of lift pins corresponding to the plurality of lift pin holders, wherein a bottom portion of each of the plurality of lift pins is disposed within a corresponding one of the plurality of lift pin holders.

14. The lift pin assembly of claim 13, wherein the first gripper includes a first set of collinear holes disposed through opposite sides of the first gripper, and wherein the support member includes a first through hole disposed coaxially with the first set of collinear holes, the lift pin holder further comprising:

a first locking pin disposed through the first set of collinear holes and the first through hole to fix a relative position of the first gripper with respect to the support member.

15. The lift pin assembly of claim 14, wherein the second gripper includes a second set of collinear holes disposed through opposite sides of the second gripper, and wherein the support member includes a second through hole disposed coaxially with the second set of collinear holes, the lift pin holder further comprising:

a second locking pin disposed through the second set of collinear holes and the second through hole to fix a relative position of the second gripper with respect to the support member.

16. The lift pin assembly of claim 13, further comprising:

an annular retaining ring disposed in an annular channel of the housing member and configured to prevent the support member, the first gripper, and the second gripper from falling out of the housing member.

17. The lift pin assembly of claim 13, wherein the first plurality of prongs are separated by a first plurality of slots, wherein the first central opening has a first inner diameter less than a diameter of the lift pin, wherein the second plurality of prongs are separated by a second plurality of slots, and wherein the second central opening has a second inner diameter less than the diameter of the lift pin.

18. The lift pin assembly of claim 17, wherein the first gripper includes a first plurality of relief holes at a bottom of the first plurality of slots and open to the first plurality of slots, and wherein the second gripper includes a second plurality of relief holes at a bottom of the second plurality of slots and open to the second plurality of slots.

19. The lift pin assembly of claim 13, wherein the housing member includes a fixation element extending through a hole in the bottom portion of the housing member and into the recess, and wherein the fixation element is configured to couple the corresponding support element to the housing member.

20. A process chamber, comprising:

a chamber body;

a lid disposed above the chamber body, wherein the lid and the chamber body define an interior volume;

a substrate support disposed within the interior volume;

a plurality of lift pin bushings disposed within the substrate support and configured to allow a corresponding plurality of lift pins to pass through the plurality of lift pin bushings; and a lift pin assembly, comprising:

a base;

a plurality of support elements extending upwardly from the base;

a plurality of lift pin holders coupled to an upper portion of corresponding ones of the plurality of support elements, wherein each of the plurality of lift pin holders comprises:

a housing member having an upper portion and a lower portion, wherein the upper portion includes an annular wall defining a central space, wherein the lower portion of the housing member includes a recess configured to receive a corresponding support element and to prevent relative rotation of the corresponding support element within the recess;

a support member disposed at least partially within the central space and having a base and an upwardly protruding portion configured to support a lift pin;

a first gripper disposed atop the support member and having a first plurality of prongs protruding upward from a body of the first gripper, wherein the first gripper includes a first central opening disposed between the first plurality of prongs and extending through body of the first gripper, wherein the first plurality of prongs are configured to grip the lift pin extending into the first central opening, and wherein the upwardly protruding portion of the support member extends into the first central opening; and a second gripper disposed atop the base of the support member and having a second plurality of prongs protruding upward from a body of the second gripper, wherein the second gripper includes a second central opening disposed between the second plurality of prongs and a third central opening extending through body of the second gripper and open to the second central opening, wherein the second plurality of prongs are configured to grip the lift pin extending into the second central opening, and wherein the first gripper is disposed within the third central opening, wherein the housing member, the support member, the first gripper, and the second gripper are coaxial.

\* \* \* \* \*